(12) United States Patent
Batres et al.

(10) Patent No.: US 7,534,633 B2
(45) Date of Patent: May 19, 2009

(54) LED WITH SUBSTRATE MODIFICATIONS FOR ENHANCED LIGHT EXTRACTION AND METHOD OF MAKING SAME

(75) Inventors: Max Batres, Santa Barbara, CA (US); James Ibbetson, Santa Barbara, CA (US); Ting Li, Ventura, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 11/083,460

(22) Filed: Mar. 17, 2005

(65) Prior Publication Data

US 2006/0001046 A1 Jan. 5, 2006

Related U.S. Application Data

(60) Provisional application No. 60/585,326, filed on Jul. 2, 2004.

(51) Int. Cl.
*H01L 21/00* (2006.01)
(52) U.S. Cl. ............... 438/22; 438/46; 438/712; 257/79; 257/103; 257/E33.067; 257/E33.068; 257/E33.074
(58) Field of Classification Search ............ 438/4, 438/22, 46, 712; 257/77, 79, 103, 190, E33.067, 257/E33.068, E33.074
See application file for complete search history.

(56) References Cited

U.S. PATENT DOCUMENTS

| | | | |
|---|---|---|---|
| 4,346,275 A | 8/1982 | Iwakiri et al. | 200/314 |
| 4,476,620 A * | 10/1984 | Ohki et al. | 438/33 |
| 4,902,356 A | 2/1990 | Noguchi et al. | 148/33.4 |
| 4,912,532 A | 3/1990 | Cook et al. | 357/16 |
| 4,946,547 A | 8/1990 | Palmour et al. | 156/643 |
| 5,087,949 A | 2/1992 | Haitz | 357/17 |

(Continued)

FOREIGN PATENT DOCUMENTS

EP 0684648 11/1995

(Continued)

OTHER PUBLICATIONS

Windisch et al., *Impact of Texture-Enhanced Transmission on High-Efficiency Surface-Textured Light-Emitting Diodes*, Applied Physics Letters, vol. 79, No. 15, Oct. 8, 2001, pp. 2315-2317.

(Continued)

*Primary Examiner*—Andy Huynh
(74) *Attorney, Agent, or Firm*—Koppel, Patrick, Heybl & Dawson

(57) ABSTRACT

The surface morphology of an LED light emitting surface is changed by applying a reactive ion etch (RIE) process to the light emitting surface. Etched features, such as truncated pyramids, may be formed on the emitting surface, prior to the RIE process, by cutting into the surface using a saw blade or a masked etching technique. Sidewall cuts may also be made in the emitting surface prior to the RIE process. A light absorbing damaged layer of material associated with saw cutting is removed by the RIE process. The surface morphology created by the RIE process may be emulated using different, various combinations of non-RIE processes such as grit sanding and deposition of a roughened layer of material or particles followed by dry etching.

21 Claims, 12 Drawing Sheets

U.S. PATENT DOCUMENTS

| | | | |
|---|---|---|---|
| 5,103,271 A | 4/1992 | Izumiya et al. | 357/17 |
| 5,200,022 A | 4/1993 | Kong et al. | 156/612 |
| 5,376,580 A | 12/1994 | Kish et al. | 437/127 |
| RE34,861 E | 2/1995 | Davis et al. | 437/100 |
| 5,502,316 A | 3/1996 | Kish et al. | 257/94 |
| 5,985,687 A | 11/1999 | Bowers et al. | 438/46 |
| 6,071,795 A | 6/2000 | Cheung et al. | 438/458 |
| 6,258,699 B1 | 7/2001 | Chang et al. | 438/458 |
| 6,274,924 B1 | 8/2001 | Carey et al. | 257/676 |
| 6,303,405 B1 | 10/2001 | Yoshida et al. | 438/46 |
| 6,365,429 B1 | 4/2002 | Kneissl et al. | 438/46 |
| 6,410,942 B1 | 6/2002 | Thibeault et al. | 257/88 |
| 6,420,199 B1 | 7/2002 | Coman et al. | 438/22 |
| 6,420,242 B1 | 7/2002 | Cheung et al. | 438/458 |
| 6,429,460 B1 | 8/2002 | Chen et al. | 257/79 |
| 6,448,102 B1 | 9/2002 | Kneissl et al. | 438/46 |
| 6,465,809 B1 | 10/2002 | Furukawa et al. | 257/94 |
| 6,468,824 B2 | 10/2002 | Chen et al. | 438/46 |
| 6,559,075 B1 | 5/2003 | Kelly et al. | 438/795 |
| 6,562,648 B1 | 5/2003 | Wong et al. | 438/46 |
| 6,607,931 B2 | 8/2003 | Streubel | 438/22 |
| 6,657,236 B1 | 12/2003 | Thibeault et al. | 257/98 |
| 6,677,173 B2 | 1/2004 | Ota | 438/22 |
| 6,716,654 B2 | 4/2004 | Hsu et al. | 438/22 |
| 6,740,604 B2 | 5/2004 | Kelly et al. | 438/795 |
| 6,757,314 B2 | 6/2004 | Kneissl et al. | 372/50 |
| 6,786,390 B2 | 9/2004 | Yang et al. | |
| 6,800,500 B2 | 10/2004 | Coman et al. | 438/22 |
| 6,806,112 B1 | 10/2004 | Horng et al. | 438/29 |
| 6,809,341 B2 | 10/2004 | Hsu et al. | 257/79 |
| 6,846,686 B2 | 1/2005 | Saeki et al. | 438/22 |
| 6,849,878 B2 | 2/2005 | Bader et al. | 257/103 |
| 6,884,647 B2 * | 4/2005 | Sakai et al. | 438/30 |
| 6,972,438 B2 * | 12/2005 | Li et al. | 257/98 |
| 2001/0010449 A1 | 8/2001 | Chiu et al. | |
| 2002/0139990 A1 | 10/2002 | Suehiro et al. | |
| 2002/0153835 A1 | 10/2002 | Fujiwara et al. | |
| 2002/0163302 A1 | 11/2002 | Nitta et al. | |
| 2004/0070004 A1 * | 4/2004 | Eliashevich et al. | 257/200 |
| 2004/0094774 A1 | 5/2004 | Steigerwald et al. | |
| 2004/0188697 A1 | 9/2004 | Brunner et al. | |
| 2005/0082562 A1 * | 4/2005 | Ou et al. | 257/103 |
| 2005/0227379 A1 * | 10/2005 | Donofrio | |

FOREIGN PATENT DOCUMENTS

| | | |
|---|---|---|
| EP | 1059667 | 12/2000 |
| EP | 1156020 A1 | 11/2001 |
| EP | 1246266 | 10/2002 |
| EP | 1263058 A | 12/2002 |
| EP | 1345275 A | 9/2003 |
| JP | 61059886 | 3/1986 |
| JP | 11238913 | 8/1999 |
| WO | WO03005458 A1 | 1/2003 |
| WO | WO03010832 | 2/2003 |

OTHER PUBLICATIONS

Schnitzer et al., *30% External Quantum Efficiency From Surface Textured, Thin-Film Light-Emitting Diodes*, Applied Physics Lett. 63(16), Oct. 18, 1993, pp. 2174-2176.

Windisch et al., *Light-Extraction Mechanisms in High-Efficiency Surface-Textured Light-Emitting Diodes*, IEEE Journal on Selected Topics in Quantum Electronics, vol. 8, No. 2, Mar./Apr. 2002, pp. 248-255.

Streubel et al., *High Brightness AlGaInP Light-Emitting Diodes*. IEEE Journal on Selected Topics in Quantum Electronics, vol. 8, No. 2, Mar./Apr. 2002, pp. 321-332.

Shor et al., *Direct Observation of Porous SiC Formed by Anodization in HP*, Appl. Phys. Lett. 62 (22), May 31, 1993, pp. 2836-2838.

Windisch et al., *40% Efficient Thin-Film Surface-Textured Light-Emitting Diodes by Optimization of Natural Lithography*, IEEE Transactions on Electron Devices, vol. 47, No. 7, Jul. 7, 2000. pp. 1492-1498.

Windisch et al., *Non-Resonant Cavity Light-Emitting Diodes*, In Light-Emitting Diodes: Research, Manufacturing, and Applications 1V, H. Walter Yao et al., Proceedings of SPIE vol. 3938 (2000), pp. 70-76.

Zangooie et al., *Surface, Pore Morphology, and Optical Properties of Porous 4H-SiC*, Journal of the Electrochemical Society, 148(6) G297-G302 (2001) Jan. 9, 2001.

Mimura, et al, *Blue Electroluminescence From Porous Silicon Carbide*, Appl. Phys. Lett 65(26), Dec. 26, 1994, pp. 3350-3352.

Khan F. A. et al, "High Rate Etching of SIC Using Inductively Coupled Plasma Reactive Ion Etching in SF6-Based Gas Mixtures", Applied Physics Letters, AIP, American Institute of Physics, Melville, NY, US, vol. 75, No. 15, Oct. 11, 1999 pp. 2268-2270.

Palmour J W et al., "Crystallographic Etching Phenomenon During Plasma Etching of SIC (100) Thin Films in SF6", Journal of the Electrochemical Society. Electrochemical Society, Manchester, New Hampshire, U.S., vol. 136, No. 2, Feb. 1, 1989, pp. 491-495.

Kelner G. et al., "Plasma Etching of Beta-SIC", Journal of the Electrochemical Society, Electrochemical Society. Manchester, New Hampshire, U.S. vol. 134, No. 1, Jan. 1987, pp. 253-254.

American Institute of Physics Handbook, Third Edition, McGraw-Hill, Ed: Dwight E. Gray, 1972.

Lagoubi, et al. "Conditioning of N-Silicon by Photoelectrochemical Etching for Photovoltaic Applications", Proc. of the 11th E.C. Photovoltaic Solar Energy Conference, Oct. 12, 1992-Oct. 16, 1992, pp. 250-253, XP008043956 pp. 252-253 Figure 8.

Patent Abstracts of Japan 07007179, Oct. 1, 1995, Sanyo Electric Co. Ltd, "Light Emitting Elements".

Journal of Optics A: Pure and Applied Optics 7 (2005) S3-S11, Review Article "Left-Handed Electromagnetism Obtained Via Nanostructured Metamaterials; Comparison With That From Microstructured Photonic Crystals", Mathias Perrin et al.

Journal of Modern Optics, vol. 52, No. 8, May 20, 2005, pp. 1155-1160, "Design and Fabrication of Omnidirectional Reflectors in the Visible Range", Weihua Lin et al.

PCT International Preliminary Report, Date: Mar. 27, 2008, PCT/US05/20603.

Related Indian Patent Application No. 4867/DELNP/2005, first examination report dated: Apr. 4, 2008.

* cited by examiner

LED WITH SUBSTRATE MODIFICATIONS FOR ENHANCED LIGHT EXTRACTION AND METHOD OF MAKING SAME

RELATED APPLICATION DATA

This application claims the benefit of U.S. Provisional patent application Ser. No. 60/585,326 filed Jul. 2, 2004.

This invention was made with government support under Contract No. 02413 awarded by DOE/NETL. The Government has certain rights in this invention.

BACKGROUND OF THE INVENTION

1. Field of the Invention

This invention relates to light emitting diodes (LEDs) and more particularly to new surface morphologies for enhancing the extraction of light from LEDs and methods of manufacturing LEDs having such surfaces.

2. Description of Related Art

Light emitting diodes (LEDs) are an important class of solid state devices that convert electric energy to light and generally comprise an active layer of semiconductor material sandwiched between two oppositely doped layers. When a bias is applied across the doped layers, holes and electrons are injected into the active layer where they recombine to generate light. Light is emitted omnidirectionally from the active layer and from all surfaces of the LED.

There has been a great deal of recent interest in LEDs formed of Group-III nitride based material systems because of their unique combination of material characteristics including high breakdown fields, wide bandgaps (3.36 eV for GaN at room temperature), large conduction band offset, and high saturated electron drift velocity. The doped and active layers are typically formed on a substrate that can be made of different materials such as silicon (Si), silicon carbide (SiC), and sapphire ($Al_2O_3$). SiC wafers are often preferred because they have a much closer crystal lattice match to Group-III nitrides, which results in Group III nitride films of higher quality. SiC also has a very high thermal conductivity so that the total output power of Group III nitride devices on SiC is not limited by the thermal resistance of the wafer (as is the case with some devices formed on sapphire or Si). Also, the availability of semi insulating SiC wafers provides the capacity for device isolation and reduced parasitic capacitance that make commercial devices possible. SiC substrates are available from Cree, Inc., of Durham, N.C. and methods for producing them are set forth in the scientific literature as well as in U.S. Pat. No. Re. 34,861; U.S. Pat. Nos. 4,946,547; and 5,200,022.

The efficient extraction of light from LEDs is a major concern in the fabrication of high efficiency LEDs. For conventional LEDs with a single out-coupling surface, the external quantum efficiency is limited by total internal reflection (TIR) of light from the LED's emission region that passes through the substrate. TIR can be caused by the large difference in the refractive index between the LED's semiconductor and surrounding ambient. LEDs with SiC substrates have relatively low light extraction efficiencies because the high index of refraction of SiC (approximately 2.7) compared to the index of refraction for the surrounding material, such as epoxy (approximately 1.5). This difference results in a small escape cone from which light rays from the active area can transmit from the SiC substrate into the epoxy and ultimately escape from the LED package.

Different approaches have been developed to reduce TIR and improve overall light extraction, with one of the more popular being surface texturing. Surface texturing increases the light's escape probability by providing a varying surface that allows photons multiple opportunities to find an escape cone. Light that does not find an escape cone continues to experience TIR, and reflects off the textured surface at different angles until it finds an escape cone. The benefits of surface texturing have been discussed in several articles. [See Windisch et al., *Impact of Texture-Enhanced Transmission on High-Efficiency Surface Textured Light Emitting Diodes*, Appl. Phys. Lett., Vol. 79, No. 15, October 2001, Pgs. 2316-2317; Schnitzer et al. *30% External Quantum Efficiency From Surface Textured, Thin Film Light Emitting Diodes*, Appl. Phys. Lett., Vol 64, No. 16, October 1993, Pgs. 2174-2176; Windisch et al. *Light Extraction Mechanisms in High-Efficiency Surface Textured Light Emitting Diodes*, IEEE Journal on Selected Topics in Quantum Electronics, Vol. 8, No. 2, March/April 2002, Pgs. 248-255; Streubel et al. *High Brightness AlGaNInP Light Emitting Diodes*, IEEE Journal on Selected Topics in Quantum Electronics, Vol. 8, No. March/April 2002].

U.S. Pat. No. 6,410,942, assigned to Cree, Inc., discloses an LED structure that includes an array of electrically interconnected micro LEDs formed between first and second spreading layers. When a bias is applied across the spreaders, the micro LEDs emit light. Light from each of the micro LEDs reaches a surface after traveling only a short distance, thereby reducing TIR.

U.S. Pat. No. 6,657,236, also assigned to Cree Inc., discloses structures for enhancing light extraction in LEDs through the use of internal and external optical elements formed in an array. The optical elements have many different shapes, such as hemispheres and pyramids, and may be located on the surface of, or within, various layers of the LED. The elements provide surfaces from which light refracts or scatters.

SUMMARY OF THE INVENTION

Briefly, and in general terms, the invention is directed to light emitting diodes (LEDs) formed by processes that allow for the creation of surfaces that provide enhanced light extraction and methods of manufacturing LEDs having such surfaces. In one of several aspects, the invention relates to a method of fabricating an LED that includes a substrate having a light emitting surface. The method includes applying a reactive ion etch (RIE) process to at least a portion of the light emitting surface for a time duration sufficient to change the morphology of the surface.

In another aspect, the invention relates to a method of fabricating an LED including a substrate having a light emitting surface having at least one cut surface with a light absorbing damaged layer of material. The method includes applying a reactive ion etch (RIE) process to the cut surface to remove at least a portion of the damaged layer of material.

In another aspect, the invention relates to an LED formed by a process that includes growing a light emission region on a first-side surface of a substrate. The light emission region includes a p-type layer of material, an n-type layer of material and an active layer between the p-type layer and the n-type layer. The process also includes applying a RIE process to at least a portion of the second-side surface of the substrate opposite the first-side surface for a time duration sufficient to change the morphology of the surface.

In yet another aspect, the invention relates to an LED formed by a process that includes growing a light emission region on a first-side surface of a substrate. The light emission region includes a p-type layer of material, an n-type layer of material and an active layer between the p-type layer and the n-type layer. The process also includes creating cuts in a second-side surface of the substrate opposite the first-side surface to form at least one cut surface having a light absorbing damaged layer of material. The process further includes applying a RIE process to at least a portion of the cut surface for a time duration sufficient to remove at least a portion of the surface damage.

In another aspect the invention relates to a light emitting diode (LED) that includes a substrate having a light emitting surface having an RIE etched surface with a dimpled texture. The LED also includes a light emission region on a surface of the substrate. The light emission region includes an active layer between first and second oppositely doped layers.

These and other aspects and advantages of the invention will become apparent from the following detailed description and the accompanying drawings which illustrate by way of example the features of the invention.

DETAILED DESCRIPTION OF THE INVENTION

The present invention provides improved light extraction for light emitting diodes (LEDs) through the addition of a particular type of surface morphology to the back surface of the LED substrate. The surface morphology is created in the substrate through one or more additional steps in the LED fabrication process.

In one embodiment the back surface morphology of a SiC substrate is modified using a reactive ion etch (RIE) process and more particularly an inductively coupled plasma reactive ion etch (ICP-RIE) process. This process creates one or more surface areas characterized by a dimpled texture on a microscopic scale. The dimpled surface provides a varying surface that allows light that would otherwise be trapped in the LED, by total internal reflection (TIR), to escape from the substrate to contribute to light emission. The variations in the surface increase the chances that the TIR light will reach the substrate surface within the critical angle and will be emitted. For light that does not escape the substrate through the surface, the variations of the surface reflect the light at different angles, increasing the chances that the light will escape on the next pass. The resultant scattering surface morphology leads to an improvement in light extraction and more light out of a packaged LED die compared to a conventional device.

In another embodiment, etched features, such as pyramids or truncated pyramids, are created in the substrate surface prior to the RIE process. These etched features are created by cutting macroscopic facets or bevels into the SiC using an angled saw blade. Despite optical modeling results suggesting they should, the bevel cuts do not by themselves result in improved light output. This is because the process of cutting the SiC substrate is believed to leave an absorbing damaged layer of material at the cut surfaces. In this instance, the RIE process removes the damaged layer of material at the cut surfaces and creates a dimpled surface on one or more substrate surface areas. The combination of the scattering dimpled surface morphology and the removal of damaged material left by the substrate cutting provides improved light output relative to a conventional device.

In another embodiment of the invention, etched features, such as pyramids, truncated pyramids, cones, hexagonal pyramids, etc., are created in the substrate surface using known masking techniques in combination with SiC etching processes, including the RIE process and wet chemistry processes such as GaP etching. These etched features may be made smaller, in both height and surface area, to produce a substrate surface having a more dense concentration of etched features than a surface with etched features made using the cutting technique. In another embodiment, the RIE process is applied to the substrate back surface after etched features have been created in the SiC and after conventional sidewall cuts have been made.

Figure 1:
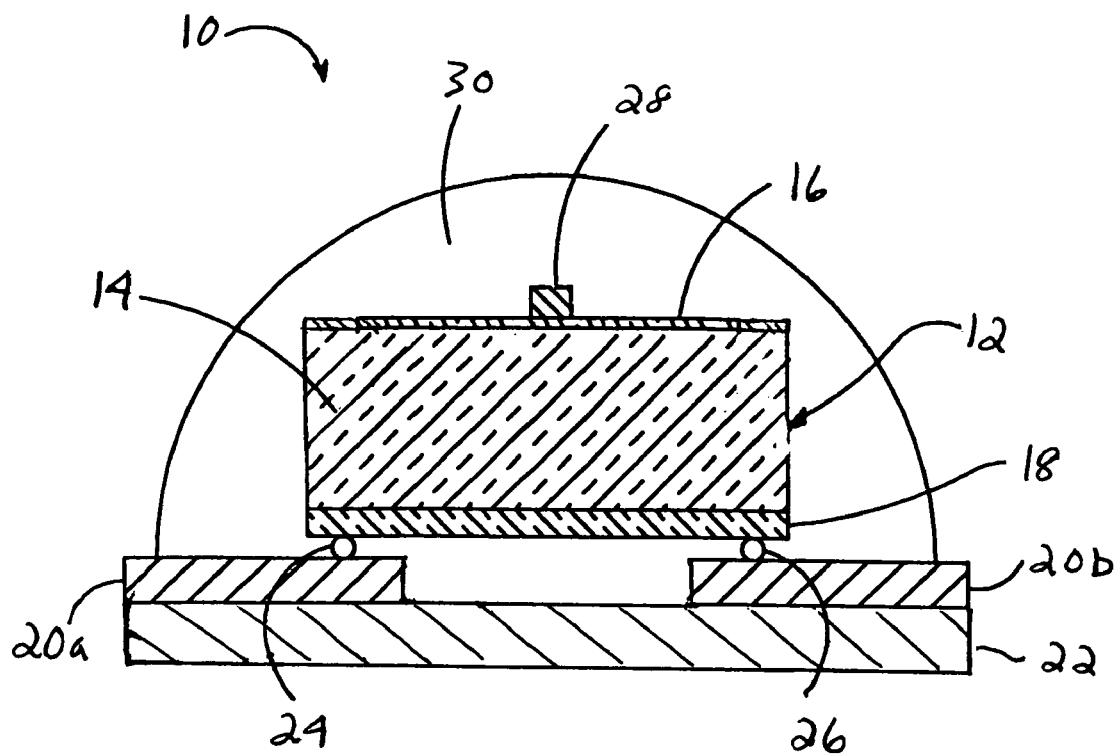
FIG. 1 is a sectional view of an LED including an emitting surface having a modified surface morphology.

Referring now to the drawings and particularly to FIG. 1, there is shown one embodiment of an LED package 10 according to the present invention, which includes an LED 12 comprising a substrate 14 having a modified back surface 16 to improve light extraction of LED light passing through the substrate. The substrate 14 can be made of many materials and can be many different thicknesses, with a suitable substrate being a 4H polytype of silicon carbide with a thickness range of 125-500 microns, although other silicon carbide polytypes can also be used including 3C, 6H and 15R polytypes. Silicon carbide has a much closer crystal lattice match to Group III nitrides than sapphire and results in Group III nitride films of higher quality. Silicon carbide also has a very high thermal conductivity so that the total output power of Group III nitride devices on silicon carbide is not limited by the thermal dissipation of the substrate (as may be the case with some devices formed on sapphire). Also, the availability of silicon carbide substrates provides the capacity for device isolation and reduced parasitic capacitance that make commercial devices possible.

The LED 12 comprises a standard emission region 18 formed on the substrate 14 using known processes such as metal-organic chemical vapor deposition (MOCVD). The operational details of conventional LEDs are known and are only briefly discussed. The LED's emission region 18 can include an active layer sandwiched between two oppositely doped layers, with the layers having standard thicknesses and the active layer emitting light omnidirectionally when a bias is applied across the oppositely doped layers.

The layers of the emission region may be fabricated from different material systems such as the Group III nitride based material systems. Group III nitrides refer to those semiconductor compounds formed between nitrogen and the elements in the Group III of the periodic table, usually aluminum (Al), gallium (Ga), and indium (In). The term also refers to ternary and tertiary compounds such as AlGaN and AlInGaN. In a preferred embodiment, the material forming the doped layers is GaN and the material forming the active layer is InGaN. In alternative embodiments the material of the doped layers may be AlGaN, AlGaAs or AlGaInP.

The LED 12 is arranged in the package 10 in a flip-chip orientation with the top of the substrate 14 being the LED's primary emission surface. Other surfaces of the substrate 14, such as the sides, also emit light but the top surface is generally the primary emission surface. The LED 12 is flip-chip mounted on first and second metal layers or solder bumps 20a, 20b which are part of a submount 22. A first contact 24 is coupled between the first metal layer 20a and one of the oppositely doped layers in the emission region 18 and a second contact 26 is coupled between the second metal layer 20b and the emission region's other doped layer. A bias can be applied to the contacts 24, 26 through the first and second metal layers 20a, 20b, and the bias is then conducted through the contact 24, 26 to the oppositely doped layers in the emission region, causing the active layer to emit light.

In other LED embodiments having a substrate that is conductive enough to transmit a charge, a substrate contact 28 can be used to apply a bias to one of the oppositely doped layers. The other doped layer is contacted to one of the contacts 24, 26 arranged between the metal layers 20a, 20b and the LED. A bias is applied to the LED through contact 28 and one of the metal layers 20a, 20b, and the bias can be conducted to the substrate contact from the other of the metal layers, through a conductive wire (not shown) that runs from the metal layer to the substrate contact.

The top surface of the metal layers 20a, 20b can also be reflective so that light emitted from the emission region toward the metal layers is reflected back to contribute to the overall emission of the LED package 10. The LED 12 and its contacts can be encased in a clear protective material 30, which is typically a transparent epoxy covering the LED 12 and the top surface of the metal layers 20a, 20b.

Alternatively, the LED 12 can be mounted on the horizontal base of a "metal cup" that typically has conductive paths (not shown) for applying a bias across the contacts on the emission regions oppositely doped layers. The top surface of the metal cup can also be reflective to reflect light from the emission region such that the light contributes to the light emission of the LED package.

The substrate 14 comprises a modified back surface 16 that, in the flip-chip arrangement of the LED 12 is the top and primary emission surface of the LED. The modified surface 16 enhances the light emission of the LED 12. The efficiency of conventional LEDs is limited by their inability to emit all of the light that is generated by the active layer. When the flip-chip arranged LED is emitting, light reaches the primary emitting substrate surface at many different angles. Typical substrate semiconductor materials have a high index of refraction compared to ambient air or encapsulating epoxy. Light traveling from a region having a high index of refraction to a region with a low index of refraction that is within a certain critical angle (relative to the surface normal direction) will cross to the lower index region. Light that reaches the surface beyond the critical angle will not cross but will experience total internal reflection (TIR). In the case of an LED, the TIR light can continue to be reflected within the LED until it is absorbed. Because of this phenomenon, much of the light generated by conventional LEDs does not emit, degrading its efficiency.

The modified surface 16 improves light extraction of the LED 12 by providing a varying surface that allows light that would otherwise be trapped in the LED, by total internal reflection (TIR), to escape from the substrate to contribute to light emission. The variations in the modified surface increase the chances that the TIR light will reach the substrate surface within the critical angle and will be emitted. For light that does not escape the substrate through the modified surface, the variations of the modified surface reflect the light at different angles, increasing the chances that the light will escape on the next pass.

Details on the characteristics of the modified surface and the process of creating the modified surface are provided below, within the context of various exemplary process runs. However, prior to describing these process runs, additional embodiments of LEDs having a modified substrate surface are described.

Figure 2:
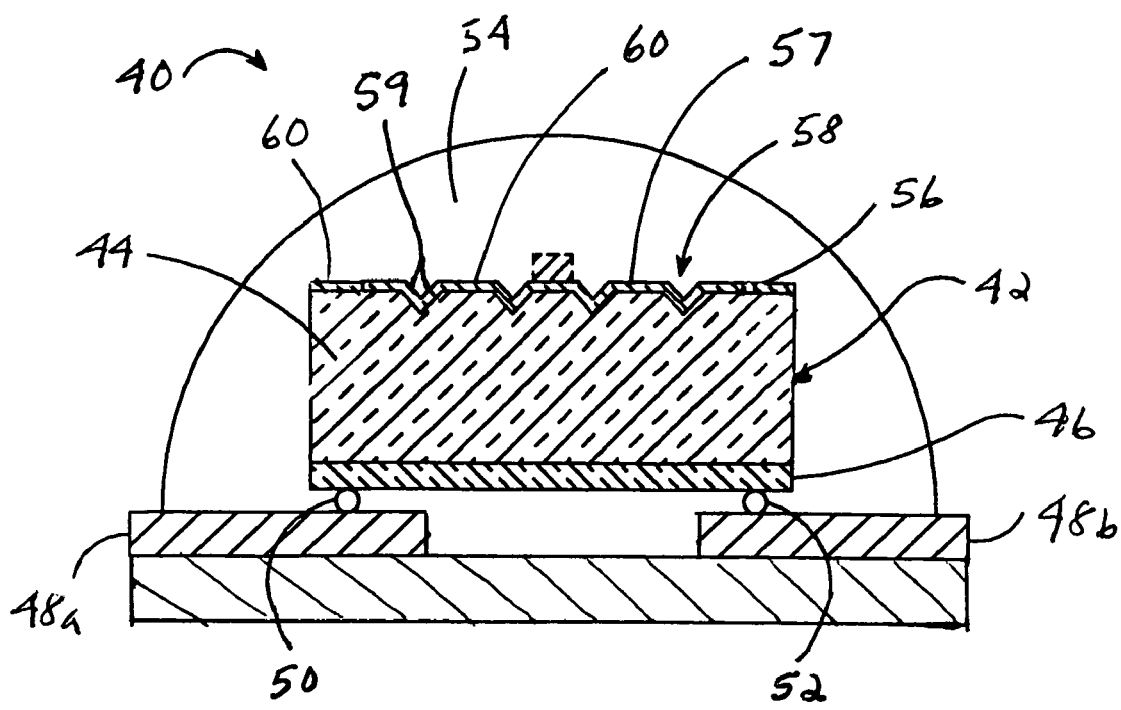
FIG. 2 is a sectional view of an LED including an emitting surface having a modified surface morphology.

Many different types of LEDs can utilize a modified surface according to the present invention to increase light extraction. FIG. 2 shows another embodiment of an LED package 40 according to the present invention that includes an LED 42 having a substrate 44 with a semiconductor emission region 46 formed on one of its surfaces. The emission region 46 is similar to the emission region 18 in FIG. 1. The LED 42 is mounted on first and second metal layers 48a, 48b having contacts 50, 52 to contact the oppositely doped layers in the emission region 46. A bias applied to the metal layers 48a, 48b can be applied to the oppositely doped layers through the contacts 50, 52. The LED 42 is flip-chip mounted such that the substrate's bottom surface is the primary emitting surface of the LED 42. The LED 42 can also be encased in a protective transparent epoxy 54.

The emitting surface 56 of the LED (surface of substrate 44) is not flat, but instead has a plurality of etched features 57, which in the configuration of FIG. 2, are truncated pyramids. The truncated pyramids 57 may be formed by cutting a plurality of bevel cuts 58 in a grid pattern using an angled saw blade. The size and shape of the truncated pyramids 57 may be varied by adjusting the depth to which the saw blade cuts into the surface of the substrate 44. In another configuration, the cut depth may be set so as to form a pyramid. It is known that the cutting process produces substantially smooth cut surfaces 59 having an overlying layer of damaged material that is light absorbing.

Upon formation of the etched features 57, the ICP-RIE process is applied to the emitting surface 56, including the cut surfaces 59 and the uncut surfaces 60. The end result is an emitting surface 56 having numerous dimpled surface areas corresponding to the uncut surfaces 60 and smooth, damage free surfaces corresponding to the cut surfaces 59. It has been observed that the ICP-RIE process changes the surface morphology of initially rough surfaces, such as the uncut surfaces 60, to dimpled surfaces; removes damaged layers of material; and leaves initially smooth surfaces, such as the cut surfaces 59, unchanged.

The etched features may also be formed using known masking techniques in combination with an etching process. For example, for a SiC substrate 44, the ICP-RIE process may be used or alternatively a wet chemistry etching process, such as GaP etching may be used. Once the etched features 57 are created and the masking is removed, the etching process, e.g., ICP-RIE, may be applied to the substrate in order to create dimpled surface areas in those areas of the surface covered by the masking.

The creation of etched features using masking/etching techniques may be considered advantageous over the bevel cutting technique for the following reasons: First, they allow for the formation of a wider variety of etched-feature geometries including, not only pyramids and truncated pyramids, but also cones and hexagonal pyramids. Second, they allow for the formation of a denser array of etched features. Third, they create the etched features without forming a layer of damaged material.

The etched features 57 enhance light extraction by providing a further variance to the surface to allow TIR light to escape from the LED. The etched features 57 in combination with the dimpled surface areas provide a greater degree of light extraction compared to a flat dimpled substrate surface, such as shown in FIG. 1.

Figure 3:
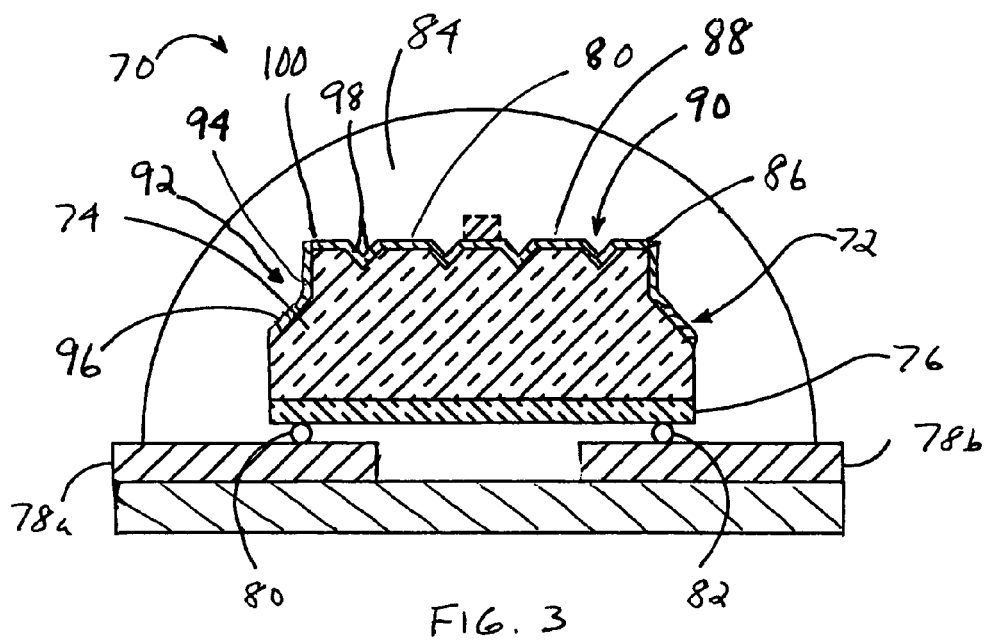
FIG. 3 is a sectional view of an LED including an emitting surface having etched features and sidewall cuts.

FIG. 3 shows another embodiment of an LED package 70 according to the present invention also having a flip-chip mounted LED 72 comprising a substrate 74 and an emission region 76. The LED 72 is mounted to metal layers 78a, 78b with contacts 80, 82 to apply a bias to the emission region 76. The LED 72 is also encased in a protective transparent epoxy 84.

The emitting surface 86 of the LED 72 includes a plurality of etched features 88, formed by a plurality of bevel cuts 90 in a manner similar to the etched features described with respect to FIG. 2. In addition, the LED 72 includes a sidewall cut 92 around its perimeter which is created using an angled saw blade. The sidewall cut 92 includes two substrate surfaces, a vertical sidewall surface 94 and an angled sidewall surface 96. The sidewall surfaces 94, 96, like the bevel cut surfaces 98, have layers of damaged material associated with them.

Subsequent to the creation of the etched features 80 and the sidewall cut 94, the ICP-RIE process is applied to the substrate surface 86, including the bevel cut surfaces 98, the angled sidewall surface 96 and the uncut surfaces 100. Because the application of the ICP-RIE process is perpendicular to the uncut surfaces 100, the process does not affect the vertical sidewall surface 94. The end result is an emitting surface 86 having numerous dimpled surface areas corresponding to the uncut surfaces 100 and smooth, damage free surfaces corresponding to the bevel cut surfaces 98 and the angled sidewall surface 96.

In an alternative configuration, a wet chemistry etching, such as GaP etching may be applied to the emitting surface 86. Unlike the ICP-RIE etching, the GaP etching affects the vertical sidewall 94 and removes the damage layer of material associated with it. This etching, however, does not produce a dimpled surface at the uncut surfaces 100.

The etched features 80 and sidewall cut 92 enhance light extraction by providing a further variance to the surface to allow TIR light to escape from the LED. The combination of etched features 80, sidewall cuts 92 and dimpled surface areas provide a greater degree of light extraction compared to a flat dimpled substrate surface, such as shown in FIGS. 1 and 2.

In accordance with the invention, the previously described embodiments of LEDs are manufactured using methods that include etching process, particularly an ICP-RIE process. Exemplary LEDs were manufactured as follows: In general, the ICP-RIE process was applied to bare 4H and 6H SiC wafers with standard backside surface finish. The ICP-RIE process involved $SF_6$ as the etchant and used standard processing conditions for SiC etching. Wafers were placed face down on sapphire carrier wafers during the ICP-RIE process. Other process conditions or chemistries may be possible, including wet chemistry etching such as GaP etching, and the invention is in no way limited to the particular conditions and chemistries described herein.

Figure 4:
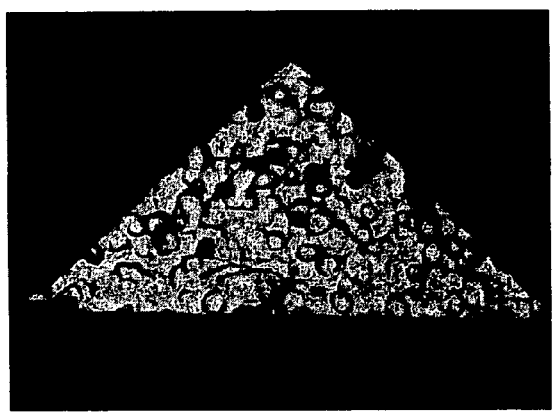
FIG. 4 is an image of an uncut surface having a dimpled surface morphology resulting from an ICP-RIE process.
Figure 5:
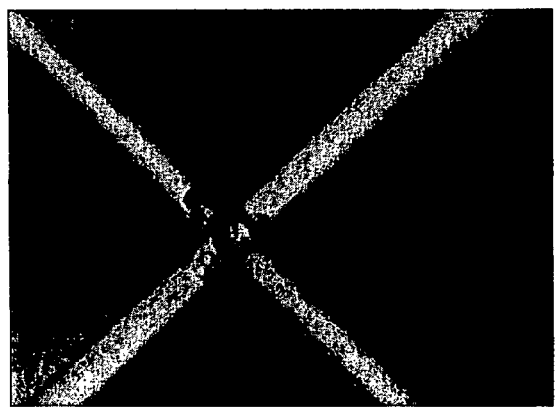
FIG. 5 is an image of the bottom of a bevel cut surface following an ICP-RIE process.
Figure 6:
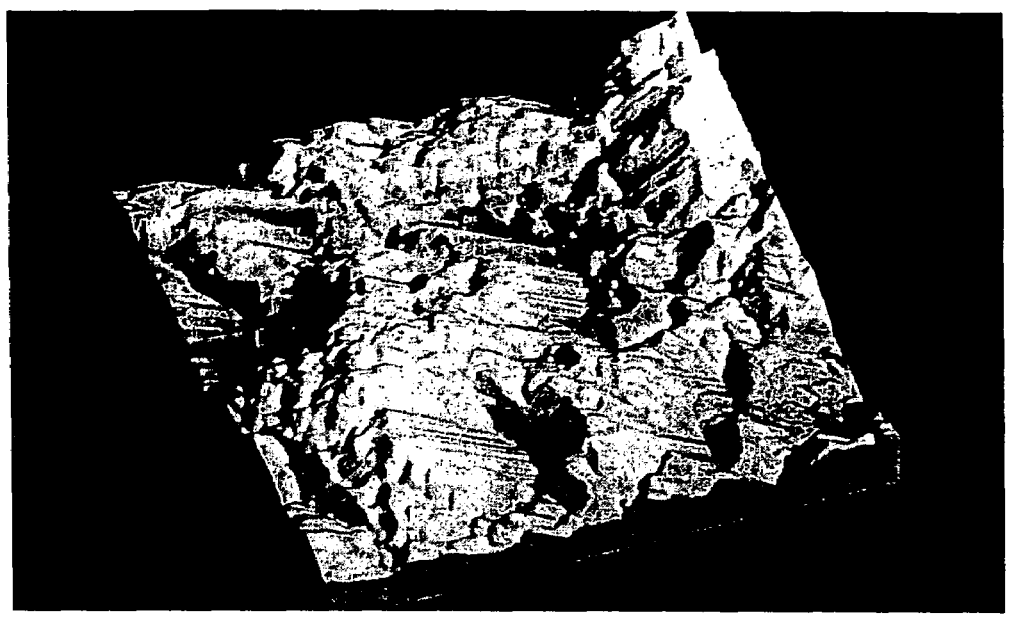
FIG. 6 is a 20 μm×20 μm scale rendering of a substrate surface prior to being modified.
Figure 7:
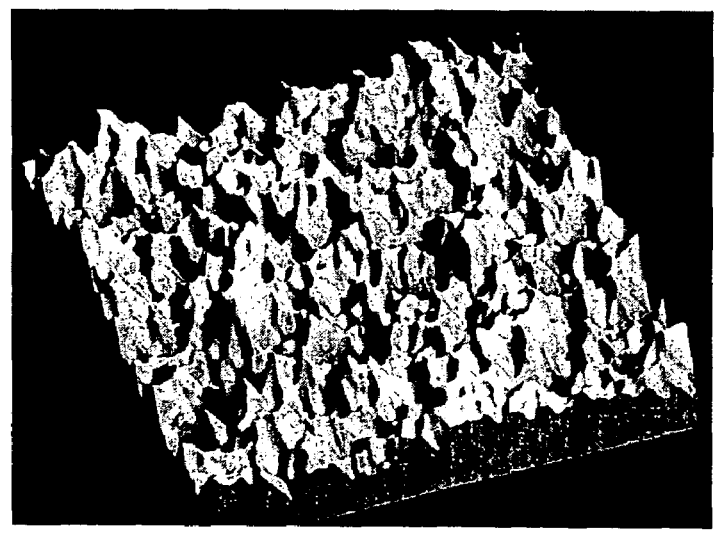
FIG. 7 is a 100 μm×100 μm scale rending of a substrate surface after ICP-RIE etching for a first time duration.
Figure 8:
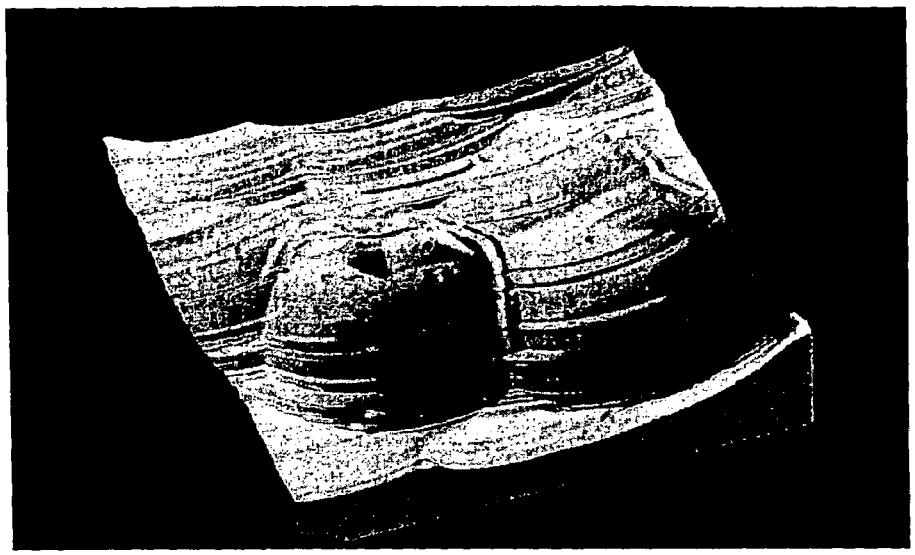
FIG. 8 is a 20 μm×20 μm scale rending of a substrate surface after ICP-RIE etching for a second time duration greater than the time duration of FIG. 7.

When applied to a substrate, the ICP-RIE process removes substrate material. In addition to removing material at an average rate per unit time, the ICP-RIE etch causes specific surfaces to form a dimpled texture on a microscopic scale. More specifically, it has been observed that an initially roughened substrate surface, such as that which results from wire cutting a substrate material core to create a wafer, will form a dimpled surface when etched, as shown in FIG. 4, while an initially smooth surface, such as that which results from saw cutting to form bevels, will remain smooth when etched, as shown in FIG. 5. The change in surface morphology from an initially roughened surface to a dimpled surface is shown in FIGS. 6, 7 and 8. FIG. 6 is a 20 μm×20 μm scale image of an SiC wafer before ICP-RIE etching. FIG. 7 is a 100 μm×100 μm scale image of a SiC wafer after ICP-RIE etching for approximately 5 minutes. FIG. 8 is a 20 μm×20 μm scale image of a SiC wafer after ICP-RIE etching for approximately 30 minutes.

Figure 9:
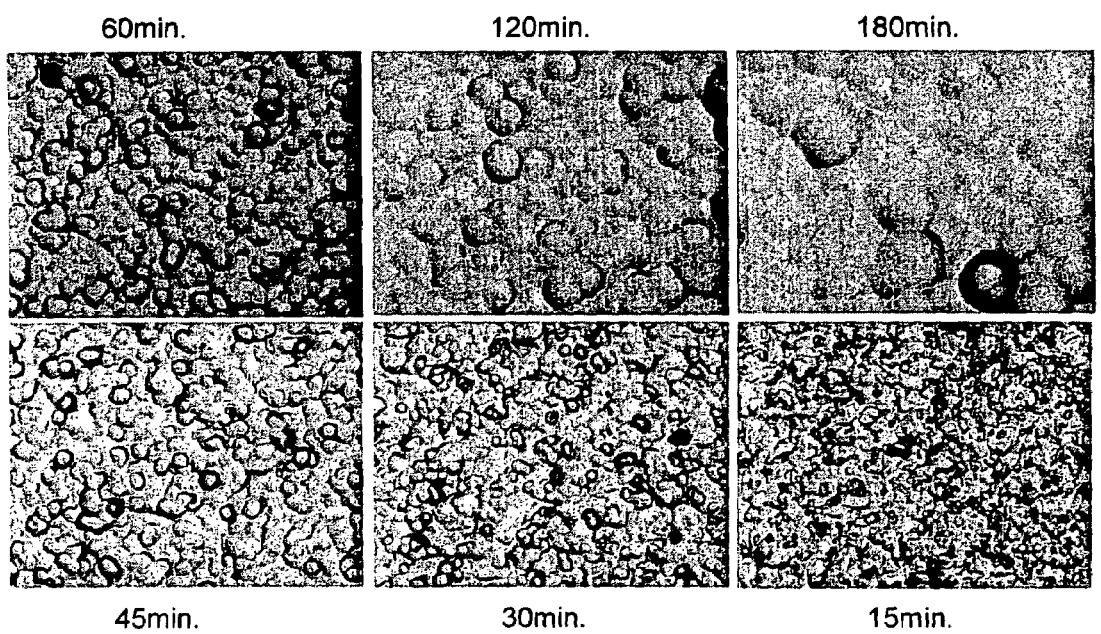
FIG. 9 is optical microscope images showing surface morphology evolution.
Figure 10:
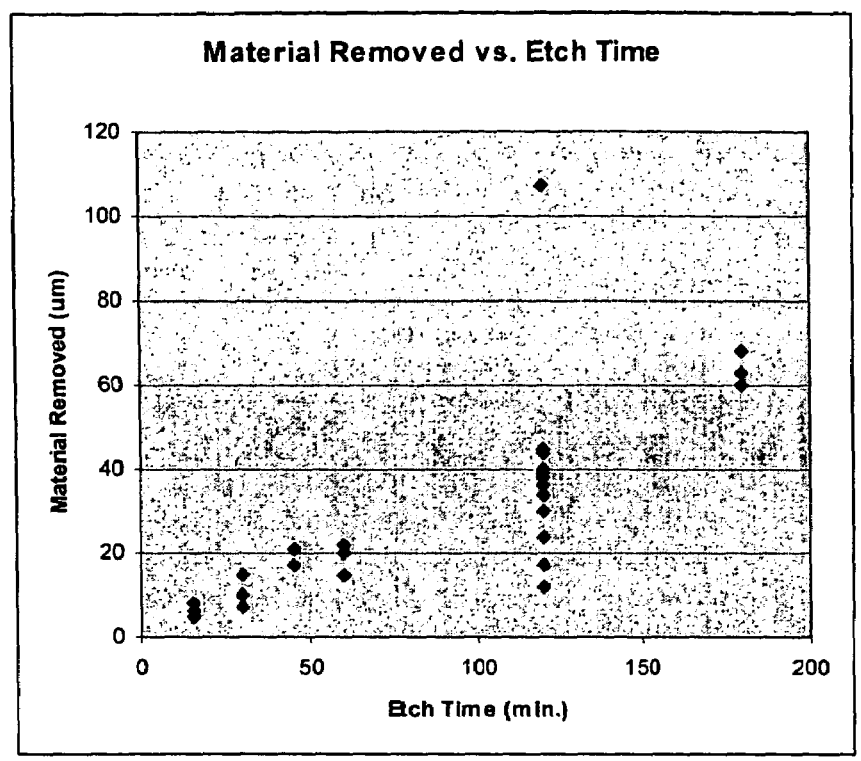
FIG. 10 is a graph of data for several wafers showing average substrate thickness removed as a function of etch time.
Figure 11:
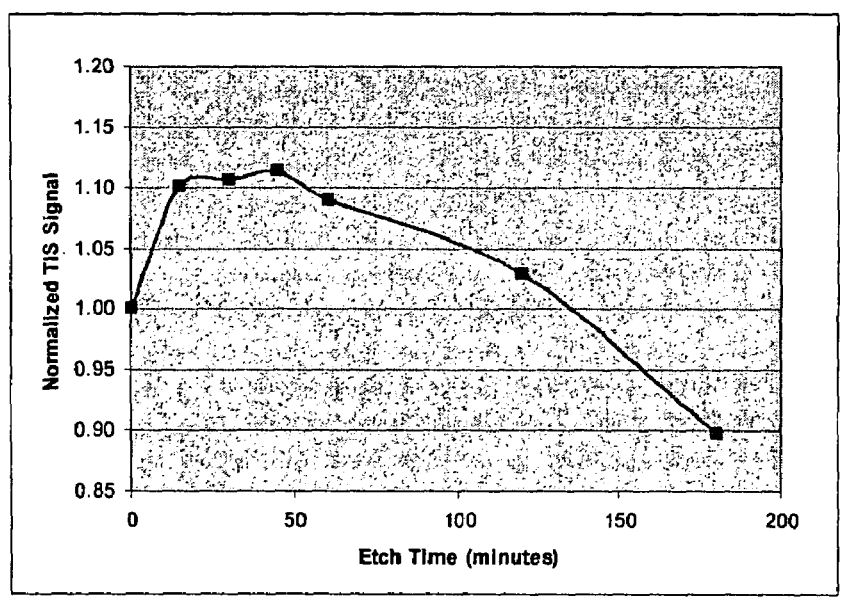
FIG. 11 is a graph of total integrated scatter signal from 4H-SiC wafers as a function of etch time.

FIG. 9 shows the evolution of the SiC surface morphology with increasing etch time. From this figure it is apparent that the dimpled produced by the ICP-RIE process increase with increased etch time. Thus, it is possible to control the surface morphology by adjusting the etch time to obtain the desired dimple size. The thickness of SiC removed by the etching process varies as a function of time. FIG. 10 is a graph of SiC material removed verses etch time. Following the etch; wafers were characterized using a total integrated scatter (TIS) tool. The TIS signal gauges how effectively surface roughness internally scatters light in a wafer and is thus a proxy for LED light extraction. TIS data shown in FIG. 11 suggest an etch time of 15 to 60 minutes is optional for the current process conditions.

The unique, dimpled surface texture created by the ICP-RIE etch is beneficial in several respects. First, the dimple morphology is more consistent and regular compared to other surface morphologies that result from other well known roughening processes (e.g. mechanical lapping), which may contribute to the enhanced light extraction observed. Second, the etch process is more controllable, and less likely to leave a damaged surface or subsurface layer than other roughening processes (e.g. mechanical lapping).

Third, the ICP-RIE etch process does not require photolithography or masking or other patterning to generate the dimple features. It is applied to a uniform, exposed SiC surface and the dimple features form spontaneously (although, as previously indicated, the formation of a dimpled surface is dependent on the specific starting surface, i.e., roughened verses smooth). Thus, the etch process is relatively simple and inexpensive to integrate into the LED fabrication flow. Fourth, the ICP-RIE etch process is flexible in that it can be inserted at a number of points in the LED fabrication process, including prior to epi growth.

Exemplary Process Runs:

LED with ICP-RIE

In one series of process runs, the ICP-RIE process was applied to 900 μm×900 μm LEDs as the final wafer level process step. Standard LED wafers were fabricated similar to the XB900-type LEDs manufactured by Cree Inc., of Durham, N.C., except with lateral contact geometry so that the n-contact was on the epi-sides of the wafer (back surface remains bare). With all else being equal, lateral geometry devices have been previously been shown to perform similarly in lamps compared to conventional, vertical geometry XB900 devices. After processing, the lateral geometry LEDs were singulated as usual, including sidewall facets, then flip-chip mounted to a Si submount with PbSn solder bumps, and then made into lamps the normal way.

In one process run (RIE#1), a 120 minute ICP-RIE process was applied to a 4H wafer. The ICP-RIE samples resulted in 23% brighter lamps compared to the historical average for conventional XB900 devices made from comparable epi material. The etch process required using a full wafer so a control sample (no etch, same wafer) was not available for direct comparison.

In another process run (RIE#3), a 120 minute ICP-RIE process was applied. For one 4H and one 6H wafer, the ICP-RIE samples resulted in 5% and 9% brighter lamps, respectively, compared to the historical average for conventional XB900 devices made from comparable epi material. The etch process required using a full wafer so control samples (no etch, same wafer) were not available for direct comparison.

LED with Bevels and ICP-RIE

Figure 12:
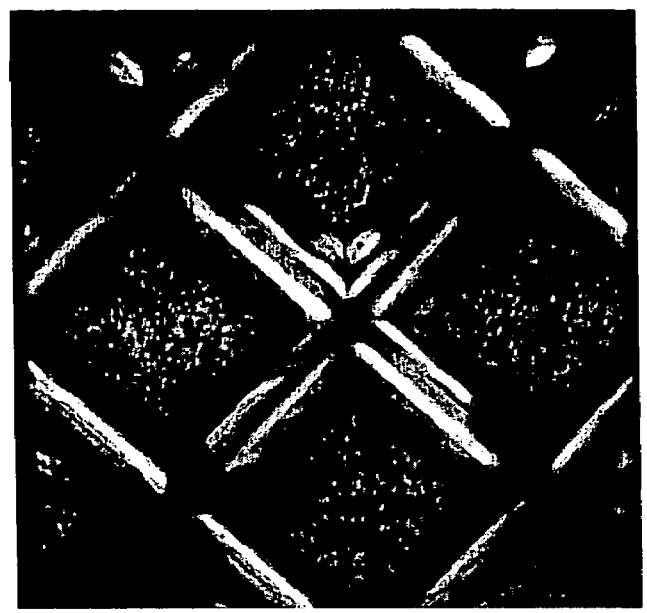
FIGS. 12-18 are photographs of examples of various bevel cuts.
Figure 13:
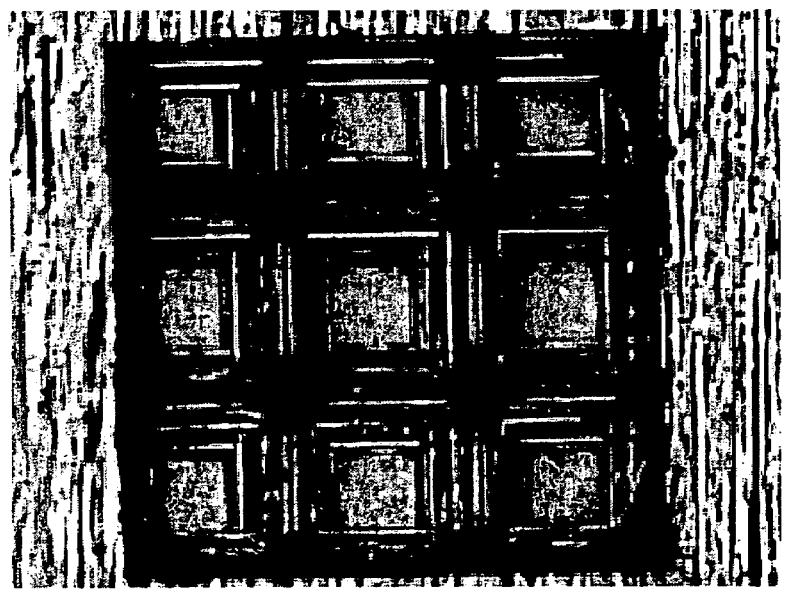
Figure 14:
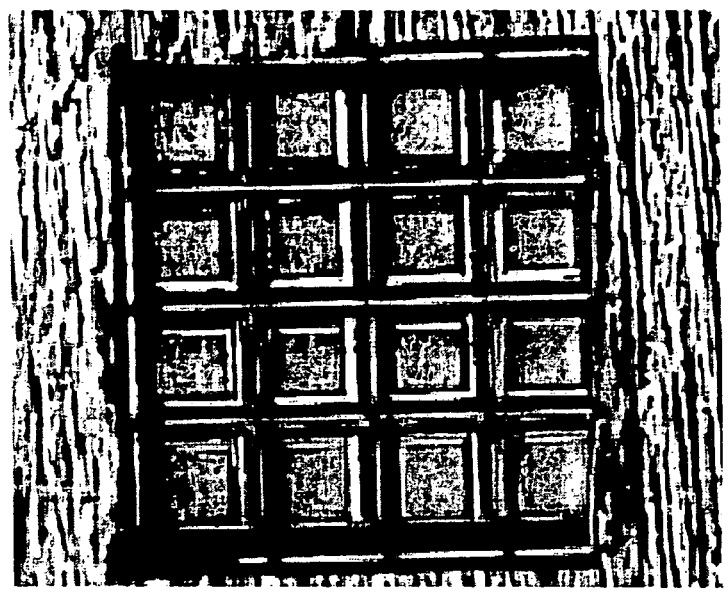
Figure 15:
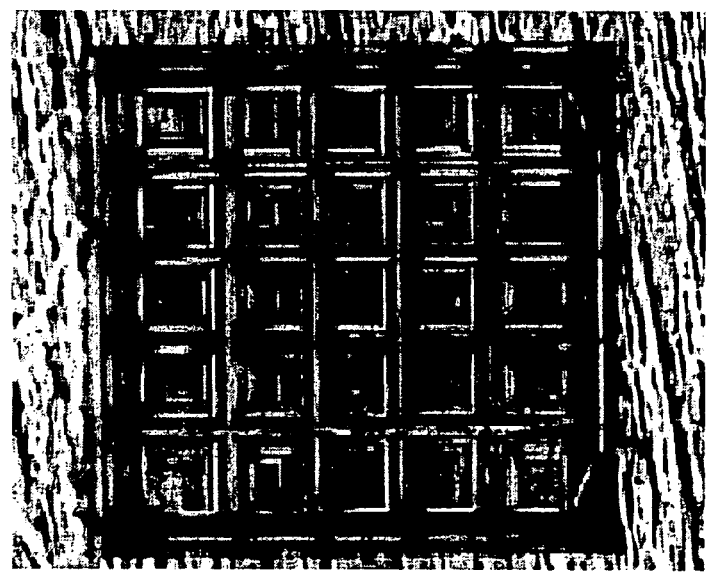
Figure 16:
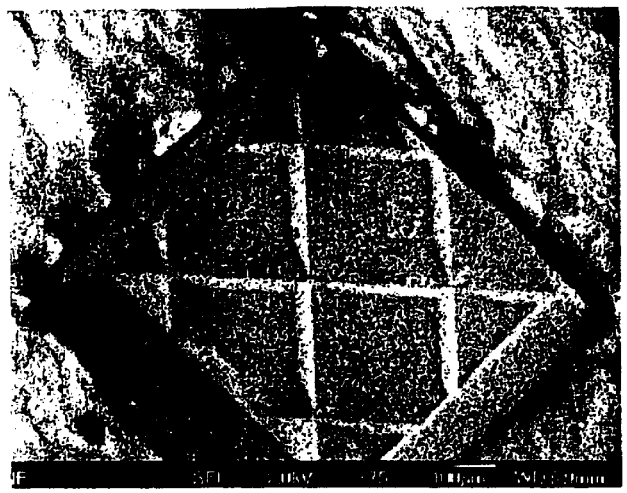
Figure 17:
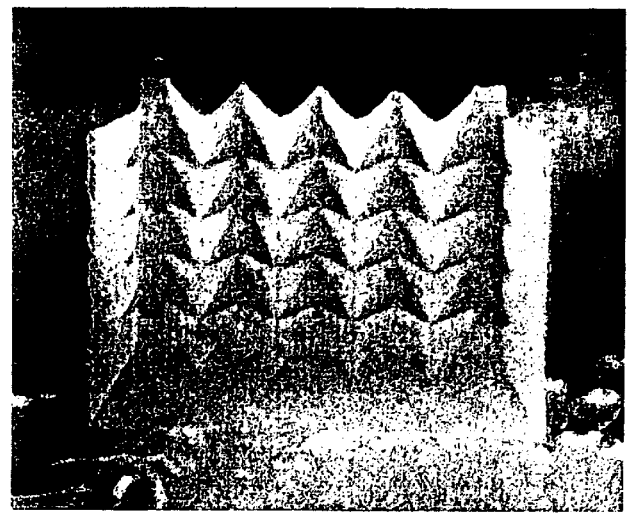
Figure 18:

In a second series of process runs, etched features were added to the substrate surface using bevel cuts that were made in the back surface of an LED wafer prior to the ICP-RIE process. The bevel cuts were made using an angled saw blade, set such that depth of the cuts was ~100 μm to ~150 μm. As in the above process runs, the LEDs were XB900-like except with a lateral contact geometry. FIGS. 12-18 show some examples of bevel cuts. In FIGS. 12 and 16, the bevel cuts are arranged diagonally relative to the perimeter of the LED, while in FIGS. 13-15, 17 and 18, the cuts are arrange perpendicularly. In FIGS. 12, 13, 14 and 16, the depth of the cuts were such that the etched features created were truncated pyramids. In FIGS. 15 and 17, the depth of the cuts was increased such that the etched features created were pyramids. In FIG. 18 the saw blade shape and depth of cuts were such that the etched features created were truncated pyramids with a square, upright projection.

Cut geometries differ than those used in the process runs are possible and may prove superior. For example, well known masking techniques may be used in combination with the ICP-RIE etching process, or other well known etching processes, such as wet chemistry etching, to form surface cuts that result in conical or hexagonal pyramid surface features. In addition to providing different etched feature geometries, these techniques allow for the formation of more etched features per unit area. This is so in view of the limitations imposed by the size of the saw blade used in the above-described bevel cutting technique. A substrate surface characterized by a dense population of etched features with shallow surface cuts is beneficial in that it may provide enough surface area to allow for the placement of an electrical contact on the substrate to produce an LED with vertical contact geometry as opposed to lateral contact geometry. The shallow cut surfaces possible when using etched cutting also result is an overall thicker substrate relative to the substrate produced by saw cutting. The increased thickness provides a less electrically resistive substrate which increases the current spreading of the substrate and thus the light output of the LED.

Regarding specific process runs, in one run (RIE#6), diagonal bevel cuts were applied to a 6H wafer followed by a 30 minute ICP-RIE process. The cuts were ~100 μm deep. The bevel+ICP-RIE sample resulted in 22% brighter lamps compared to the ICP-RIE only sample. A sample with diagonal cuts in only one direction gave approximately half as much improvement.

In another process run (RIE#7), diagonal bevel cuts were applied to three 4H wafers followed by a 60' ICP-RIE process. The cuts were ~100 μm deep. For wafers #1 and #2, the bevel+ICP-RIE sample and the ICP-RIE only sample resulted in lamps of comparable brightness. For wafer #3, the bevel+ICP-RIE sample resulted in lamps that were 10% brighter than the ICP-RIE only sample. The etch required full wafers at the time so control samples (no etch, no bevels) were not directly available. However, the bevels and ICP-RIE surface were subsequently polished off, i.e., removed, from wafer #3 and lamps were made from the bevel+ICP-RIE+polish sample and compared to standard LED wafers that had been similarly polished. This allowed us to deduce that the bevel+ICP-RIE process resulted in ~25% brighter lamps compared to standard LEDs.

In yet another process run (RIE#9), quarter wafers were used for the ICP-RIE process. Diagonal bevels ~100 μm deep were applied to the SiC prior to etching for (a) 30 minutes and (b) 60 minutes. For a 4H wafer, the bevel+30' ICP-RIE and bevel+60' ICP-RIE process resulted in 10% and 14% brighter lamps, respectively, compared to control samples (no etch, no bevels). For 6H wafer, the bevel+30' ICP-RIE and bevel+60' ICP-RIE process resulted in 14% and 22% brighter lamps, respectively, compared to control samples.

In the foregoing set of process runs, additional process steps included the application of faceted saw cuts ('bevels') across the back surface of the substrate, followed by an ICP-RIE process that creates areas having dimpled surface texture and removes surface damage related to the saw cuts. These process steps are beneficial for various reasons. First, compared to existing faceting technology, which imparts angled sidewalls only at the perimeter of the chip, the bevels produce a larger area of angled facets on the back surface of a chip. This allows the faceting technology to scale with increasing chip size.

Second, it has been shown that the bevels by themselves do not reliably result in better light extraction (and can even make things worse). The ICP-RIE process allows the theoretical light extraction benefits of bevels to be realized by removing the damaged surface layer resulting from the cutting process.

Third, compared to an alternate method for removing surface damage related to the bevels—wet etching of SiC—the dimpled surface texture provided by the ICP-RIE helps scatter TIR light into the escape cones of the bevels. It also may be easier to manufacture in the sense that the front side of the wafer is easier to protect from the etchant.

LED with ATON, Bevels and ICP-RIE

In a third series of process runs, the ICP-RIE process was applied after bevel cuts and conventional sidewall (ATON) cuts were made to lateral geometry XB900 wafers. The LED wafer was bonded to a sapphire carrier wafer during the ICP-RIE process to prevent premature breaking at the deep sidewall cuts. Otherwise the process was similar to that described above. Since the ICP-RIE process occurred last, substantially all saw damage is removed.

In one process run (RIE#10), a 4H and 6H wafer with the bevel+ATON+ICP-RIE process resulted in 21% and 22% brighter lamps than control samples (same wafer, ATON only), respectively.

Although the present invention has been described in detail with reference to certain preferred configurations thereof, other versions are possible. For example, instead of a lateral-contact geometry LEDs, the processes described above may be applied to vertical-contact geometry LEDs. In vertical-contact geometry LEDs, care would have to be taken to protect the n-contact metal region during the ICP-RIE process.

Other etchant chemistries, including wet chemistry may be used. For example, GaP etching may be used as an alternative method to ICP-RIE for removal of surface damage. The ICP-RIE process may be applied to substrates of various thicknesses including those used in ultra thin LEDs such as the EZ-XT LEDs manufactured by Cree, Inc. The ICP-RIE process may also be applied to future 'thin chip' LEDs, including chip-scale package LEDs, where a highly scattering surface roughness is desired.

The present invention may be used in all flip-chip LED products, but especially large area LEDs. It is easiest to implement with lateral contact geometry devices but is applicable to vertical geometry devices as well. The ICP-RIE process may be applied to all ATON or otherwise cut surfaces to remove saw damage. The ICP-RIE process may be applicable for other types of LED substrates (sapphire, GaP, etc.).

The invention may allow for greater flexibility in mechanical treatment processes currently applied to SiC (i.e. grit size of saw, wire saw speed, dicing saw speed) by providing a means to remove surface damage.

Figure 19:
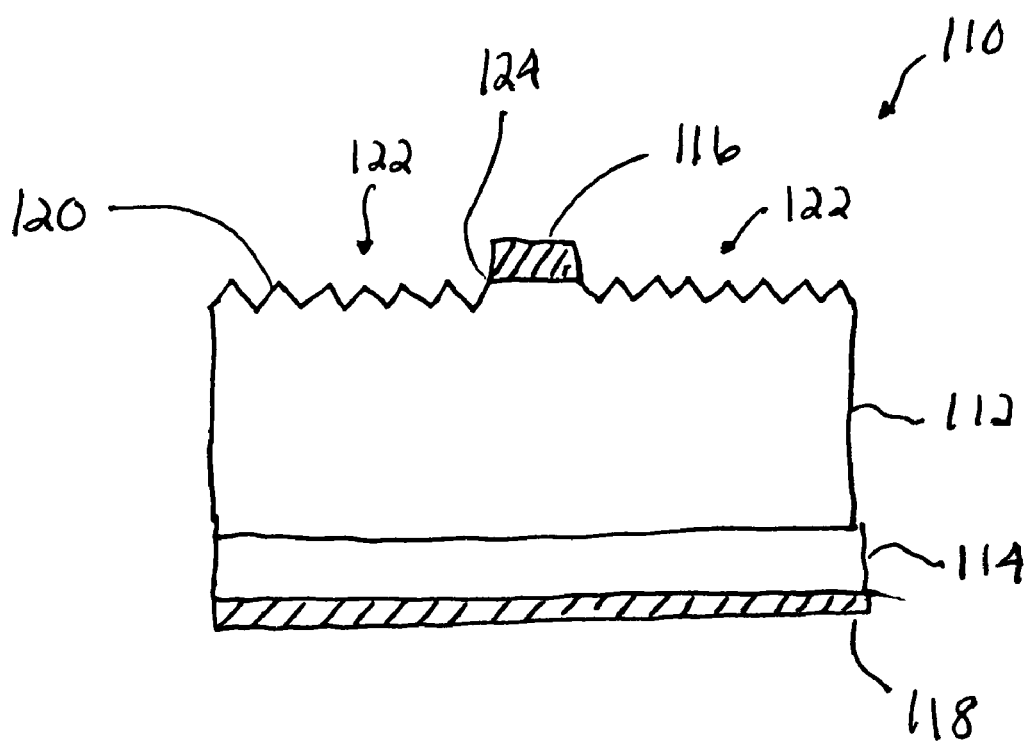
FIG. 19 is a sectional view of an LED including an emitting surface having surface morphology.

FIG. 19 shows another embodiment of an LED 110 according to the present invention that includes a conductive substrate 112 with a semiconductor emission region 114 formed on one of its surfaces. The emission region 114 is similar to the emission region 18 in FIG. 1. The LED 110 includes first and second contacts 116, 118 that contact the oppositely doped layers in the emission region 114. When a bias is applied to the oppositely doped layers, through the contacts 116, 118, light is emitted. The LED 110 may be flip-chip mounted such that the substrate surface 120 opposite the emission region 114 is the primary emitting surface of the LED.

Portions 122 of the primary emitting surface 120 include a surface morphology that includes a collection of geometric elements. Attributes, including element "profile" or shape, e.g., cones, pyramids, hemispheres, and element "depth," along with the "periodicity" of elements, i.e., spacing between like features, e.g., peaks, of adjacent elements, may be used to characterize a particular surface morphology. As explained below, in one configuration, these morphed portions 122 of the emitting surface 120 are formed entirely and directly in the substrate 112 and preferably without the use of a mask. In other configurations, the morphed portions 122 are formed at least partially within the substrate. In other configurations the morphed portions 122 are formed in another layer of material on top of the emitting surface 120 of the substrate 112.

Other portions 124 of the primary emitting surface 120, such as the portion beneath the first contact 116, are substantially smooth. The smooth surface provides for a large surface area of direct contact between the contact 116 and the substrate 112 which in turn allows for efficient transfer of current from the contact into the substrate.

Figure 20:
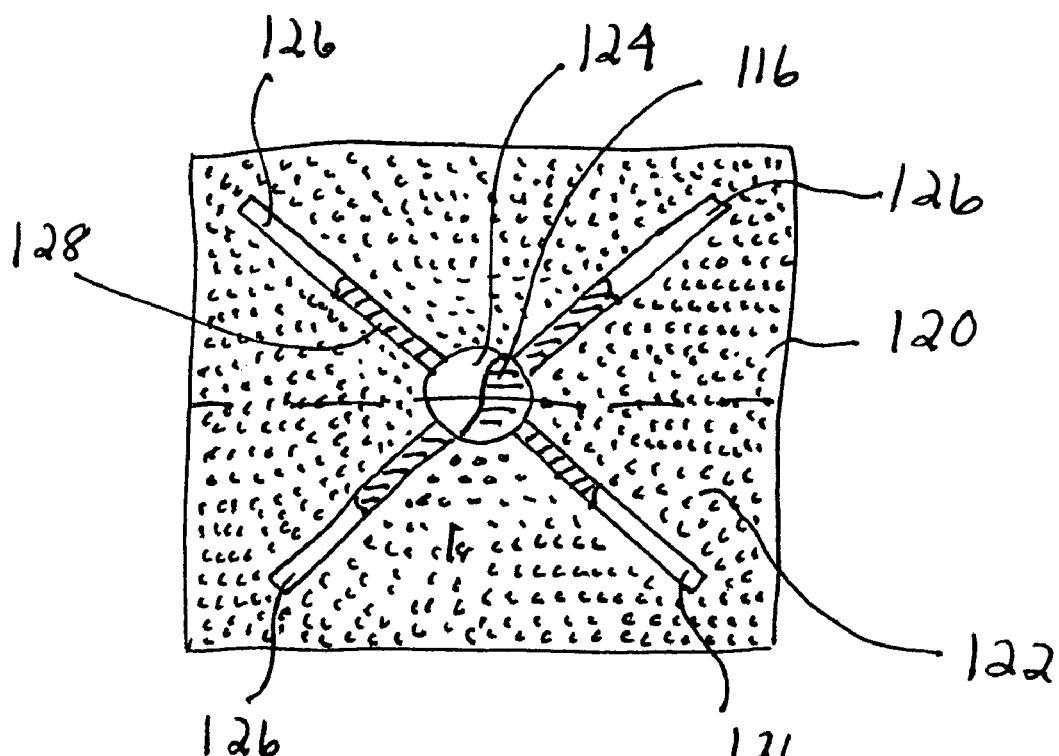
FIG. 20 is a top view of the of the LED of FIG. 19.

With reference to FIG. 20, in a preferred embodiment, the primary emitting surface 120 includes additional smooth surface areas 126. Conductive elements 128 are formed on these surface areas 126 and are electrically connected to the first contact 116. These additional conductive elements 128 form a current spreading structure that provides for more efficient distribution of current across the surface area of the substrate 112. These smooth portions 124, 126 are formed by masking the top surface 120 of the substrate prior to creating the morphed portions 122.

Figure 21:
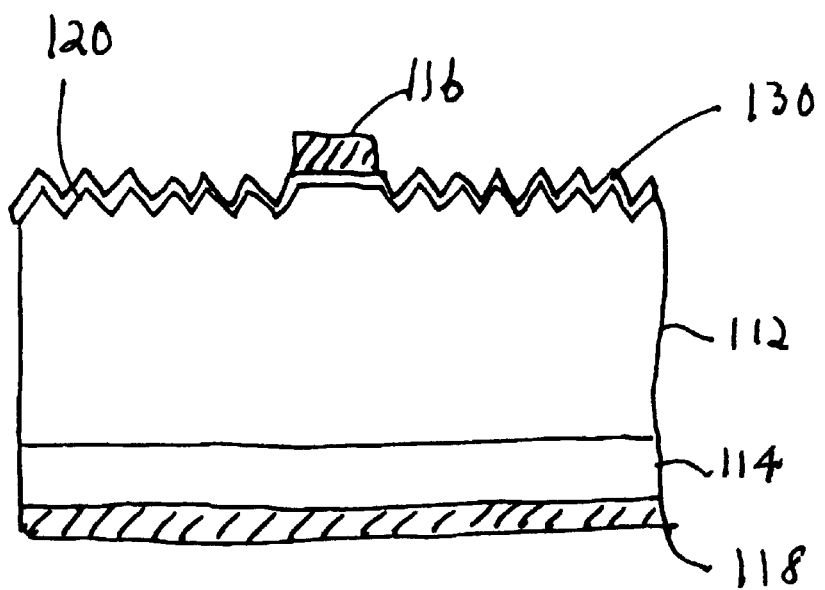
FIG. 21 is a sectional view of an LED including a surface with an overlying layer of transparent conducting material.

With reference to FIG. 21, in an alternative configuration, more efficient current spreading is provided by a current spreading layer 130 located on the primary emitting surface 120. In one configuration, the current spreading layer 130 is a layer of transparent conducting material that is deposited on the primary emitting surface 120. The transparent conducting material may a metal, such as Pd, Ni or Au, having a thickness of between approximately 2 nm and 20 nm; a transparent conducting oxide, such as indium tin oxide, having a thickness of approximately 100 nm; or a semiconductor material.

For the semiconductor material configuration, the material may be an additional layer of heavily doped semiconductor material that is deposited on the primary emitting surface 120. In this context, "heavily doped" means more doped than the substrate 112. Such semiconductor materials may include, for example, SiC, GaN and AlInGaN. The material generally has the same or similar refractive index as the substrate 112 and the same n-type or p-type doping as the substrate. Thus, if the substrate 112 is formed of n-type SiC the layer of additional material 130 may be n-type SiC or AlInGaN; and if the substrate is formed of n-type GaN, the additional material would be n-type GaN. The thickness of the semiconductor material layer depends on the doping concentration. For example, if the doping concentration is greater than $1^{20}$ cm$^{-3}$, a thickness of approximately 100 nm should be sufficient.

Figure 22:
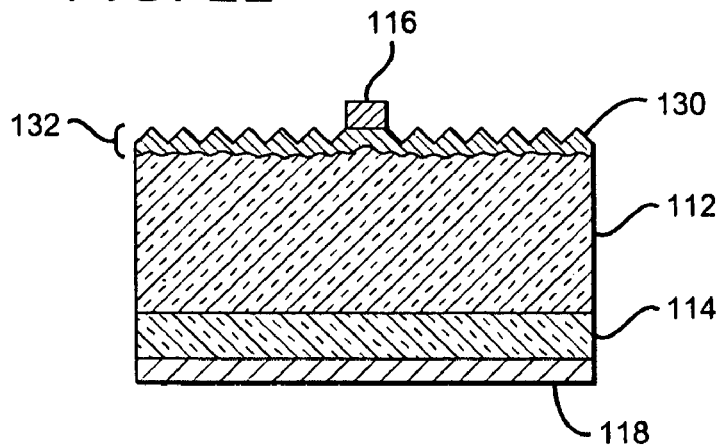
FIG. 22 is a sectional view of an LED including a surface morphology formed in a current spreading region of the substrate.

With reference to FIG. 22, in another configuration, the current spreading layer 130 is part of the substrate 112 itself. In this embodiment, a top surface region 132 of the substrate 112 is subjected to further doping to increase its conductivity. The heavily doped, top surface region 132 of the substrate 112 provides current spreading without the need for an additional layer of material. In this context, "heavily doped" means that the top surface region 132 of the substrate 112 is more heavily doped than the remaining portion of the substrate. The thickness of this more heavily doped region 132 of the substrate depends on the doping concentration. For example, if the doping concentration is greater than $1^{20}$ cm$^{-3}$, a thickness of approximately 100 nm should be sufficient.

Figure 23:
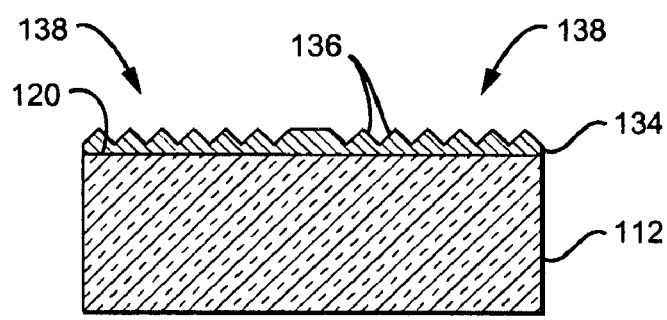
FIG. 23 is a sectional view of an LED substrate having a non-continuous layer formed on its top surface.

With reference to FIG. 23, in another embodiment, the morphed portions 122 (FIG. 19) are formed by coating the emitting surface 120 with a thin, non-continuous layer 134 of material or particles. A "non-continuous layer" as used herein means a layer, which may be formed of one or more sub-layers, having top surface elements 136 that cause the layer to have a cross section of non-uniform thickness, at a microscopic level. The surface morphology 138 of the non-continuous layer 134 is then transferred at least partially to the substrate 112 by either partially or completely removing the non-continuous layer. "Transferred" as used in this context means that after partial or complete removal of the non-continuous layer 134, the substrate 112 surface has substantially the same surface morphology that the non-continuous layer had prior to the removal or partial-removal process.

The non-continuous layer 134 is preferably removed using a dry etch process. As a cost saving measure, the dry etching process is preferably not an RIE process, and may be, for example, involve etching with a fluorine-containing gas such as nitrogen trifluoride, nitrous oxide, ammonium trifluoride, oxygen, sulfur hexafluoride, carbon tetrafluoride, or mixtures thereof. Exemplary techniques for dry etching silicon carbide are set forth in U.S. Pat. Nos. 4,865,685 and 4,981,551 which are incorporated entirely herein by reference. In this embodiment, the non-continuous layer 134 is made of material or materials that etch at approximately the same rate as the substrate 112. Such an etching rate ensures that the surface morphology 138 of the non-continuous layer 134 transfers at least partially to the substrate 112.

In other embodiments, the surface morphology 138 of the non-continuous layer 134 may not match the desired surface morphology for the substrate 112. For example, the depth of the elements 136 on the surface of the non-continuous layer 134 may be larger than desired. In this case, the non-continuous layer 134 may be made of material or materials that etch at a faster rate relative to the substrate 112. The end result is a substrate 112 with a surface morphology having elements with less depth than the elements 136 of the non-continuous layer 134. The characteristics of the surface morphology of the non-continuous layer 134 and the etch rates of the non-continuous layer relative to the substrate 112, allow for control of the shape of the substrate surface morphology. Through proper selection of each, the desired substrate surface morphology may be obtained.

In one configuration, the non-continuous layer 134 is formed by depositing a thin layer of metal, e.g., gold or aluminum, under conditions that make the layer non-continuous. For example, the metal may be exposed to a temperature that is high enough to result in diffusion of the metal and formation of islands projecting from the surface of the layer. Higher temperatures and longer exposure times will result in fewer, larger islands. Thus the size, shape and density of the islands may be controlled by temperature and exposure time to create the desired surface morphology.

In other configurations, the non-continuous layer 134 is formed by first depositing a uniform layer of metal and then making the uniform layer non-uniform by 1) depositing a non-continuous mask layer over the uniform layer and then etching the layer of metal to form the desired surface morphology; or 2) depositing nano-particles on the uniform layer using an aerosol or other gas-phase chemical reaction and then etching to form the desired surface morphology on the underlying uniform layer.

In another embodiment, the non-uniform layer 134 may be formed of nano-particles. The particles may be suspended in a liquid that is evenly deposited over the substrate surface 120 by, for example, using a spinner with a rotation speed determined by the desired thickness of the layer of particles and the properties of the liquid. Once the liquid layer is deposited, the liquid may be evaporated at elevated or room temperature to remove the liquid and leave only the particles. In another embodiment, a layer of particles may be sprayed directly on the substrate surface 120. The particles may be formed of metals such as gold or aluminum, ceramics such as alumina or silicon carbide or silica or boron nitride, carbon such as graphite or bucky balls, or organic materials.

In processes using a dry etch, a damaged layer of material may remain on the morphed portions 122 of the emitting surface 120. In these cases, the material forming the damaged layer may be removed by etching the morphed portions 122 using known chemical etching processes, such as a KOH process or flowing gases such as hydrogen or hydrogen chloride. Alternatively, the damaging affects of the material forming the damaged layer may be substantially reduced by annealing processes. In this case, the annealing process serves two functions; it activates the dopants in the substrate and it reduces the affect of the damaged layer.

In another embodiment, the morphed portions 122 are created using well known grit polishing processes. In these processes, grit particles, e.g., diamond particles, abrade the light emitting surface 120 to change the surface morphology from a generally smooth surface to a roughened surface. The density of particles in the grit, the size of the particles, and the abrasive force between the particles and the surface 120 are selected such that the resultant surface morphology has a periodicity.

Figure 24:
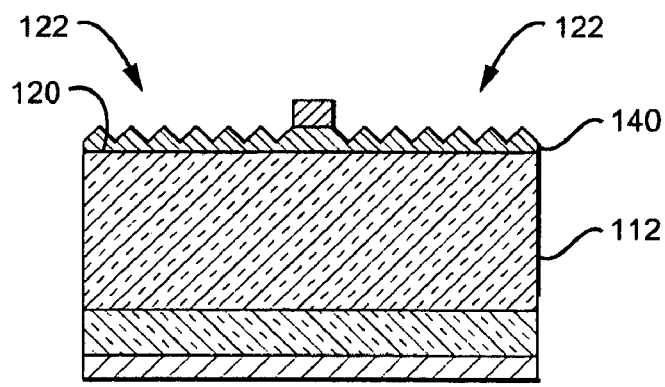
FIG. 24 is a sectional view of an LED including an additional, surface morphology layer on its substrate.

With reference to FIG. 24, in another configuration, the morphed portions 122 are formed in a layer of material 132 that is deposited on top of the emitting surface 120 of the substrate 112. Preferably, the material has a refractive index that is substantially the same as the substrate. For example, the material 140 is deposited on a SiC substrate 112 may be SiC or AlInGaN; while the material deposited in a GaN substrate may be GaN. The material 140 also has the same n-type or p-type doping as the substrate 112. The material may be deposited using well known, lower temperature techniques, such as MOCVD, CVD, HVPE, MBE or sputtering. The desired surface morphology may be obtained through control of growth conditions, such as temperature. For example, a medium deposition temperature is more likely to produce the desired surface morphology as opposed to too high or too cool deposition temperatures which would likely result in a smooth surface. Surface morphology formation is also dependent on the type of wide bandgap semiconductor being deposited. For GaN, the group V/III ratio will significantly impact morphology. Also, N-polar GaN is typically highly faceted grown under typical MOCVD growth conditions.

In another embodiment, particles of the substrate 112 material or a material having a similar index of refraction are deposited on the top surface 120 of the substrate. The particles are then mechanically fixed to the surface 120 through adhesion or annealing. The size, shape and density of the particles are selected such that the resultant surface morphology 122 has a periodicity.

It will be apparent from the foregoing that while particular forms of the invention have been illustrated and described, various modifications can be made without departing from the spirit and scope of the invention. Accordingly, it is not intended that the invention be limited, except as by the appended claims.

We claim:

1. A light emitting diode (LED) formed by a process comprising:
   growing a light emission region on a first-side surface of a substrate, the light emission region comprising a p-type layer of material, an n-type layer of material and an active layer between the p-type layer and the n-type layer;
   applying a subtractive process to a second-side surface of the substrate opposite the first-side surface to create nonplanar features on the second-side surface; and
   applying a reactive ion etch (RIE) process to at least a portion of the second-side surface for a time duration sufficient to texturize the second-side surface and remove damaged portions of the nonplanar features, the textured second-side surface comprising a light extraction surface.

2. The method of claim 1 wherein the RIE process is an inductively coupled plasma reactive ion etch (ICP-RIE) process.

3. The process of claim 1 wherein the RIE process is applied prior to growing the emission region.

4. The process of claim 1 wherein the RIE process is applied after growing the emission region.

5. The process of claim 1 wherein the RIE process is applied for a time period ranging from between approximately 15 and 180 minutes.

6. The process of claim 1 further comprising cutting a plurality of bevels into the second-side surface to form a plurality of etched features having associated surface areas that form at least part of the second-side surface.

7. The process of claim 6 wherein the cutting is performed prior to applying the RIE process.

8. The process of claim 1 further comprising forming a plurality of sidewall cuts forming sidewall surfaces that form at least part of the second-side surface.

9. The process of claim 8 wherein the cutting is performed prior to applying the RIE process.

10. The process of claim 1 further comprising forming p-type and n-type contacts on the first-side surface of the substrate such that the p-type and n-type contacts contact the p-type and n-type material of the light emission region, respectively.

11. The process of claim 1 further comprising forming a p-type contact on one side of the first and second side surface of the substrate and forming an n-type contact on the other side of the first and second side surface such that the p-type and n-type contacts contact the p-type and n-type material of the light emission region, respectively.

12. The LED of claim 1, wherein the subtractive process comprises cutting.

13. A light emitting diode (LED) formed by a process comprising:
    growing a light emission region on a first-side surface of a substrate, the light emission region comprising a p-type layer of material, an n-type layer of material and an active layer between the p-type layer and the n-type layer;
    creating cuts in a second-side surface of the substrate opposite the first-side surface to form at least one cut surface having a light absorbing damaged layer of material; and
    applying a reactive ion etch (RIE) process to at least a portion of the cut surface for a time duration sufficient to form a texturized portion and to remove at least a portion of the damaged layer of material so that the LED exhibits increased light extraction compared to a similar LED without the RIE process applied to its cut surface.

14. The process of claim 13 wherein the RIE etching process is an inductively coupled plasma reactive ion etch (ICP-RIE) etching process.

15. The process of claim 13 wherein the RIE process is applied prior to growing the light emission region.

16. The process of claim 13 wherein the RIE process is applied after growing the light emission region.

17. A light emitting diode (LED) formed by a process comprising:
    growing a light emission region on a first-side surface of a substrate, the light emission region comprising a p-type layer of material, an n-type layer of material and an active layer between the p-type layer and the n-type layer; and
    applying a reactive ion etch (RIE) process to at least a portion of the second-side surface of the substrate opposite the first-side surface for a time duration sufficient to change the morphology of the surface, the portion of the second-side surface having the change in morphology comprising a nonporous light extraction surface.

18. A light emitting diode (LED) formed by a process comprising:
    growing a light emission region on a first-side surface of a substrate, the light emission region comprising a p-type layer of material, an n-type layer of material and an active layer between the p-type layer and the n-type layer;
    creating cuts in a second-side surface of the substrate opposite the first-side surface to form at least one nonporous cut surface having a light absorbing damaged layer of material; and
    applying a reactive ion etch (RIE) process to at least a portion of the nonporous cut surface for a time duration sufficient to remove at least a portion of the damaged layer of material so that the LED exhibits increased light extraction compared to a similar LED without the RIE process applied to its cut surface.

19. A light emitting diode (LED) formed by a process comprising:
    growing a light emission region on a first-side surface of a substrate, the light emission region comprising a p-type layer of material, an n-type layer of material and an active layer between the p-type layer and the n-type layer;
    applying a substractive process to a second-side surface of the substrate opposite the first-side surface to create nonplanar features on said second-side surface;
    applying a reactive ion etch (RIE) process to at least a portion of the second-side surface for a time duration sufficient to texturize the second-side surface and remove damaged portions of the nonplanar features, the textured second-side surface comprising a light extraction surface; and
    adding a transparent current spreading layer on at least a portion of the second-side surface.

20. The LED of claim 19, wherein the transparent current spreading layer comprises Indium Tin Oxide (ITO).

21. The LED of claim 19, wherein the subtractive process comprises cutting.

* * * * *